(12) United States Patent
Absalom

(10) Patent No.: US 8,427,830 B2
(45) Date of Patent: Apr. 23, 2013

(54) COOLING SYSTEM

(75) Inventor: Thomas Absalom, Hertfordshire (GB)

(73) Assignee: JCA Technology, Letchworth Garden City, Hertfordshire (GB)

(*) Notice: Subject to any disclaimer, the term of this patent is extended or adjusted under 35 U.S.C. 154(b) by 256 days.

(21) Appl. No.: 12/664,198

(22) PCT Filed: Jun. 9, 2008

(86) PCT No.: PCT/GB2008/050425
§ 371 (c)(1),
(2), (4) Date: May 28, 2010

(87) PCT Pub. No.: WO2008/152416
PCT Pub. Date: Dec. 18, 2008

(65) Prior Publication Data
US 2010/0252233 A1  Oct. 7, 2010

(30) Foreign Application Priority Data
Jun. 12, 2007 (GB) .................................. 0711247.7

(51) Int. Cl.
H05K 7/20 (2006.01)
(52) U.S. Cl.
USPC ...... 361/691; 361/679.51; 700/278; 454/184; 62/259.2
(58) Field of Classification Search .................... 361/679.46–679.51, 688–695, 361/752
See application file for complete search history.

(56) References Cited

U.S. PATENT DOCUMENTS

| 7,500,911 B2* | 3/2009 | Johnson et al. ............... 454/184 |
| 7,643,291 B2* | 1/2010 | Mallia et al. .................. 361/695 |
| 7,646,602 B1* | 1/2010 | Tamarkin et al. ............. 361/695 |
| 7,826,216 B2* | 11/2010 | Moss ........................ 361/679.49 |
| 7,903,407 B2* | 3/2011 | Matsushima et al. ......... 361/695 |
| 2003/0209023 A1* | 11/2003 | Spinazzola et al. .......... 62/259.2 |
| 2004/0065097 A1 | 4/2004 | Bash et al. |
| 2004/0206101 A1* | 10/2004 | Bash et al. ....................... 62/180 |
| 2005/0011208 A1 | 1/2005 | Dobbs et al. |
| 2006/0225449 A1 | 10/2006 | Dorrich et al. |
| 2007/0135032 A1* | 6/2007 | Wang ............................ 454/184 |
| 2008/0098763 A1* | 5/2008 | Yamaoka ..................... 62/259.2 |
| 2011/0105010 A1* | 5/2011 | Day ............................. 454/184 |

FOREIGN PATENT DOCUMENTS

| EP | 0741269 A2 | 11/1996 |
| WO | 0186217 A1 | 11/2001 |
| WO | WO 2001-086217 A | 11/2001 |
| WO | 2004049773 A2 | 6/2004 |

(Continued)

OTHER PUBLICATIONS

International Search Report for PCT/GB2008/050425 mailed Oct. 22, 2008.

(Continued)

Primary Examiner — Courtney Smith
(74) Attorney, Agent, or Firm — Withrow & Terranova, PLLC

(57) ABSTRACT

A system for cooling an environment housing a plurality of electronic equipment in one or more cabinets is disclosed, the system comprising a remote cooling unit(s) adapted to provide relatively cool air into the environment, an exhaust associated with each cabinet, the exhaust being provided with variable airflow means; the remote unit being adapted to receive exhausted air; and; sensor means adapted to determine cooling demand and alter the output of the remote cooling unit(s) accordingly. Schemes for using the system are described.

21 Claims, 7 Drawing Sheets

FOREIGN PATENT DOCUMENTS

| | | |
|---|---|---|
| WO | 2006111789 A1 | 10/2006 |
| WO | WO 2006-111789 A | 10/2006 |
| WO | 2006124240 A2 | 11/2006 |
| WO | WO 2006-124240 A | 11/2006 |
| WO | 2007054578 A1 | 5/2007 |
| WO | WO 2007-054578 A | 5/2007 |

OTHER PUBLICATIONS

UK Search Report for UK Patent Application No. 0711247.7 issued Oct. 16, 2007.

* cited by examiner

Supply air 20-22degC - Return air 40-44degC

Selection through equipment cabinet

Supply air 20-22degC - Return air 40-44degC

COOLING SYSTEM

BACKGROUND

1. Field of the Disclosure

This invention relates to a cooling system for cooling data centres (i.e. environments where a plurality of IT equipment, eg data servers, is operated).

2. Technical Background

By far the most popular design of existing cooling systems for data centres is the use of downflow (CRAC) units. These rely on CRAC (Computer Room Air Conditioning) units supplying cool air into a raised modular floor plenum effectively creating a higher pressure in the void than in the ICT space. This increased pressure forces cool air out of floor grilles that are generally located in what is termed a cold aisle. A cold aisle is an aisle between ICT equipment racks that has floor grilles across its width and length and has the front of two sets of racks facing one another. Cool air is drawn into the front of the equipment cabinet by the ICT equipment and discharged at the rear of the rack. The rear of the racks will generally face one another to form a 'hot aisle'. The 'hot aisle' will not have any floor tiles and may have some form of baffling to assist in returning hot air back to the CRAC units to cool and re-circulate once again.

The CRAC units are generally cooled either by a chilled fluid such as water or a water/glycol mixture or by a DX (direct expansion) system utilising refrigerants such as R22, R134a, R407C or R410A. Chilled fluid systems would be connected to an external 'chiller'. Direct expansion systems would be connected to an external means of heat rejection typically an air cooled condenser or condensing unit. Occasionally water cooled DX systems may be used in which case the CRAC unit would be connected to one or more dry air coolers (radiators) or cooling tower(s).

CRAC units currently control to return air temperature. If the return air temperature falls below set point then the cooling capacity of the unit is reduced (by staging compressors or altering coolant fluid flow rates) whilst keeping the airflow constant. This results in the supply air temperature rising and the temperature differential over the CRAC unit becoming less.

FIGS. 1 and 2 show two typical installations of downflow CRAC units. Figure one shows a typical CRAC unit located in a room with an open top return to the CRAC unit. Figure two shows a similar system but this time return air is passed via a suspended ceiling void to the top of the CRAC unit. The supply air (i.e. air supplied to cabinets) is at about 14 to 16° C. and return air at about 22 to 24° C.

The main benefits of the downflow CRAC unit method are its flexibility in terms of locating equipment racks and that redundant units can be located in the room so that if a unit needs maintaining or fails there will be sufficient 'standby' capacity in the room for the ICT equipment to continue functioning unaltered.

Data centres are designed to have varying grades of redundancy to ensure that the ICT equipment is continuously available to the business. The most common forms are known as N+1 and 2N where N is the total cooling required to maintain design operation of the data centre. Taking an example of each grade of redundancy;

N+1=a data centre that has a total cooling load of 200 kW that is satisfied with 4 No 50 kW CRAC units but is fitted with a fifth 50 kW unit to provide +1 redundancy therefore N (4×50 kW)+1(1×50 kW).

2N=a data centre with the same 200 kW cooling load that is satisfied with 4 No. 50 kW CRAC units but is fitted with a further 4 No 50 kW unit to provide +N redundancy therefore N (4×50 kW)+N(4×50 kW) which equates to 2N.

It is clear that N+1 is less expensive than 2N and satisfies most commercial data centre operators requirements in terms of facility resilience, this makes it the most popular option.

The disadvantages of the downflow CRAC unit method are that is cools the room, not just the ICT rack, it is not controlled at the ICT rack level and that it moves more air than is required and at temperatures that do not suit ICT equipment which will be further explained later.

An alternative existing ICT cooling solution is the use of rack coolers.

Despite some attempt at segregation hot aisle/cold aisle etc CRAC units tend to be used to cool the data centre itself and in doing so ensure that the ICT equipment is cooled. Rack coolers cool at the ICT equipment rack level.

Rack coolers generally consist of a cooling coil across which air from the rack is passed by fans. The cooling coil may be in the base of the rack and cool air be passed up the front face of the cabinet, or it may be mounted between the racks passing cold air across the front and taking the hot return air from the back of the rack. In some instances the rack is not closed to the data centre and the cooler sits on the back of the rack and cools the hot air as it leaves the rack.

Cooling mediums for these methods can be pumped refrigerant, CO2, or a chilled fluid such as water. In all methods heat rejection plant will be positioned externally to transfer the heat to atmosphere.

FIGS. 3 and 4 show two typical types of rack cooler. Figure three shows a rack cooler with the chilled water coil at its base and warm air is drawn down the back of the rack and cool air is forced up the front face of the rack. Figure four shows a similar system, this time the air is pushed horizontally across the front face of the rack and is drawn back at the rear of the rack, across the chilled water coil to begin the process once more. Supply air is typically at about 20 to 22° C. and return air at about 40 to 44° C.

The main benefits of rack coolers is that they control at a rack, not room level, and that the temperatures and airflows better match that of modern ICT equipment.

Disadvantages are that redundancy is required at the rack level which means that N+1 (the most popular configuration) is exactly the same solution as 2N. Each rack has its own cooler therefore to have N+1 each rack must have two coolers which is the same as 2N.

Another disadvantage is that the secondary cooling medium has to be run within the data centre. Some data centre operators are understandably nervous about moving large quantities of water or high pressure CO2 local to their business critical ICT equipment.

Finally, the cooling available from a rack cooler due to its different operating parameters is greater than that of the CRAC downflow system but because the rack is sealed the control loop is very tight. Some rack coolers are marketed as having up to 30 kW cooling capacity. The rack cooler is a closed system so if it were to fail there would be very little thermal inertia which results in thermal cut-out of standard ICT equipment within 5 seconds of the cooling failing.

Most if not all cooling methods of the modern data centre singularly fail to recognise that ICT equipment is perfectly capable of cooling itself as long as it is presented with the right quantity and temperature of air at its inlet and that the hot air rejected is managed away to prevent it short cycling and passing to the front of the equipment again.

The IBM blade server is an example of ICT equipment that has been developed over recent years. This server would be housed in what IBM would refer to as a Blade Center® that would comprise a plurality of these servers.

Published figures for an IBM Blade Center® (at time of writing) are 5.1 kW heat rejection based on an airflow rate of 220 l/s.

It is designed to have air introduced to its front face at between 20 and 22 degrees centigrade (° C.).

Based on the data above and using a standard equation for the calculation of nett sensible cooling we can derive that if 220 l/s of air was presented at the front face at 20° C. and it absorbed 5.1 kW of heat it would be discharged from the rear of the blade centre 19.3 degrees Kelvin (° K.) higher than it entered. So we can see that the ideal in terms of cooling for this piece of ICT equipment would be 220 l/s of air at 20° C. presented to its front face and then discharged from the rear at 39.3° C.

The table below shows the operating parameters of the two main cooling methods used and compares them with the requirements of this example of ICT equipment.

TABLE 1

| Criteria | Example Server | CRAC System | Rack Cooler |
| --- | --- | --- | --- |
| Supply temperature (° C.) | 20.0 | 14.0 | 20.0 |
| Return temperature (° C.) | 39.0 | 24.0 | 42.0 |
| Temperature differential | 19.0 | 10.0 | 22.0 |
| l/s air per kW cooling | 44.0 | 83.3 | 37.8 |

It is clear from the data above that the rack cooler method most closely matches the requirements of the server but asks the ICT equipment to have a higher temperature differential across it (due to supplying too little air) than the ideal. The CRAC system controls the room temperature and supplies air at too low a temperature which is inefficient and also supplies too much air, again this is inefficient.

FIG. 5 illustrates this imbalance. Each cabinet 7 in this example is populated with two blade systems (generating 10.2 kW). The air from the cabinets is at about 33° C. at a flow rate of about 0.44 m³/S. The maximum airflow in the cold aisle 6 (from the CRAC 1 through floor void 3 will be 2 m³/S, giving 1 m³/S per rack (in this example), i.e. about 12 kW.

SUMMARY OF THE DETAILED DESCRIPTION

Regardless of the amount of air supplied to the front face of the server, it will only ever draw across it the design flow rate of its internal fans. This point is stressed again because it is instrumental to the new invention's effectiveness that works in harmony with the ICT equipment not in isolation to it and in doing so provides large energy saving opportunities.

The present invention arose in an attempt to provide performance similar to that of the rack cooler but with the flexibility and benefits of CRAC systems.

The present invention arose from the understanding that ICT (Information Communication Technology) equipment, servers, routers, switches etc have a cooling design and philosophy of their own. Each item of ICT equipment that is air cooled (majority of ICT equipment) will generally have one or more heat sinks complete with fans to dissipate the heat energy produced as part of their operation.

With these facts in mind, the cooling solution is designed to work in harmony with the ICT equipment's requirements, to the improvement of the operating efficiency of the ICT and cooling process.

By maintaining a constant air temperature to the front of equipment racks that house ICT components and removing air at a constant temperature once the ICT equipment has used the cool air (to absorb the heat energy it generates) it is possible to operate a modification to an existing downflow cooling system in a way that ensures air is delivered to only those equipment racks that need it (racks will often have varying heat rejection values across a data centre) and allows for massive opportunities in terms of energy saving by using existing freecooling methods.

In a further aspect, the invention provides a system for cooling an environment housing a plurality of electronic equipment in one or more ICT (Information Communication Technology) equipment racks comprising one or more remote cooling units that introduce relative cool air into the space, an active exhaust product associated with each of the equipment cabinets, the active exhaust being provided with temperature sensing and variable airflow means; the remote unit being designed to receive air at relatively high temperatures and vary air volume as a means of controlling cooling capacity to maintain a constant temperature differential between the supply and return sides of the remote unit.

The invention further provides cooling apparatus for electronic equipment mounted within one or more data cabinets, comprising a cabinet exhaust unit mounted to receive exhaust air from a cabinet and which comprises variable airflow means which is controlled to maintain constant return air temperature.

In a further aspect, there is provided cooling apparatus for data centres, each centre comprising a plurality of data cabinets housing ICT equipment, comprising an active cabinet exhaust unit mounted to receive air from each cabinet and which comprises variable airflow means which is controlled to maintain constant return air temperature.

Furthermore, there is provided a method of controlling the climate of a data centre, comprising providing a cooling unit adapted to output relatively cool air to the data centre; means associated with each item of equipment or groups of items of equipment comprising an active cabinet exhaust for receiving exhausted air from the equipment cabinet, which active cabinet exhaust comprises variable airflow means and means for returning the exhausted air, via the active airflow means, back to the cooling unit, and further comprising sensing one or more parameters to determine the cooling demand or other parameters and using this to vary the cooling and airflow output.

BRIEF DESCRIPTION OF THE FIGURES

Embodiments of the invention will now be described, by way of example only, with reference to the accompanying schematic drawings, in which.

DETAILED DESCRIPTION

The cooling system of the present invention is a system designed to match the cooling requirements of the ICT equipment and in doing so present huge energy savings by utilising existing freecooling technology.

Figure 1:
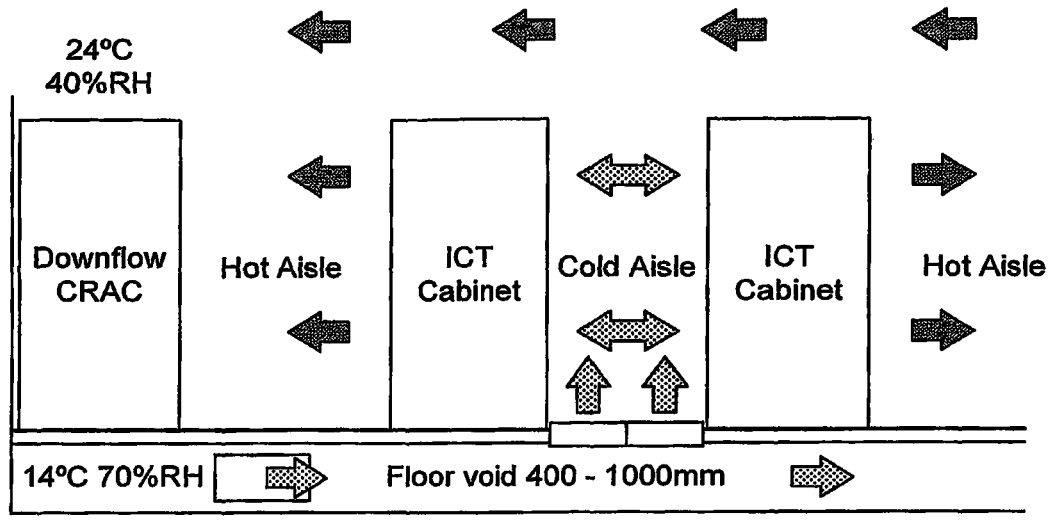
FIG. 1 shows a previously proposed CRAC system with open top return.
Figure 2:
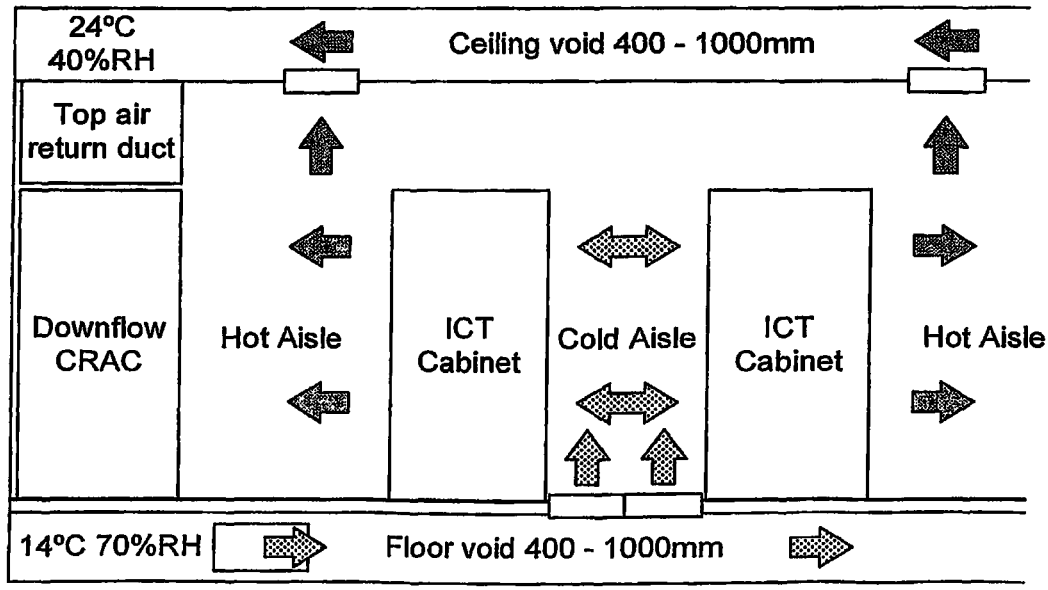
FIG. 2 shows a previously proposed CRAC system with ceiling void return.
Figure 3:
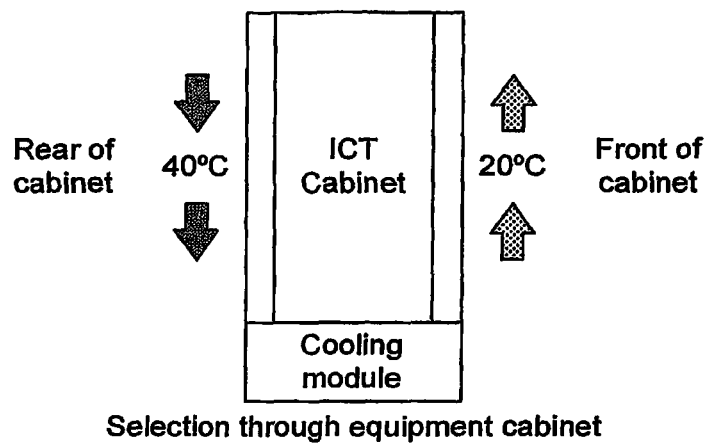
FIG. 3 shows a previously proposed rack cooler system.
Figure 4:
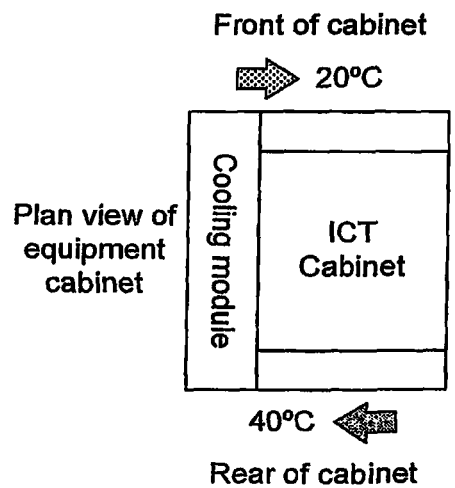
FIG. 4 shows an alternative previously proposed rack cooler system.
Figure 5:
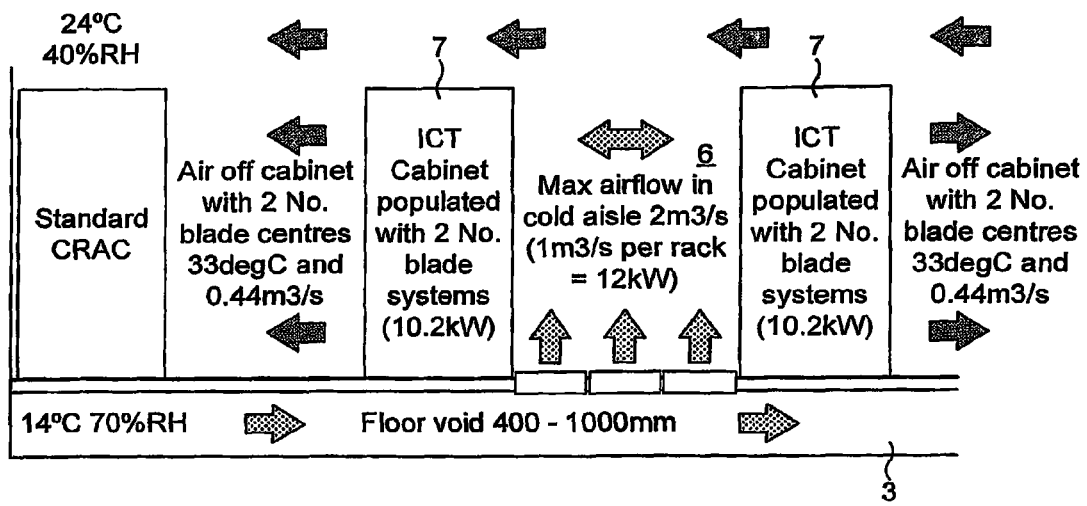
FIG. 5 shows how a typical CRAC downflow system does not match ICT requirements.

The main failure of an existing CRAC system is that it controls the room, not the ICT equipment supply and exhaust, and this results in air supply that is too cool and that is over supplied to take away any hotspots which are bound to occur when the ICT equipment is not matched to the cooling system. FIG. 5 shows how a typical CRAC downflow system is mismatched to the requirements of the ICT equipment.

The diagram shows how each cabinet housing 2 No. servers requires half the airflow actually provided and air could be supplied 6° C. higher. But in order to remove hot spots and maintain the room at a desirable temperature (20 to 22° C. approx. 1.7 m from the raised modular floor is typical) more air is provided and by the time the over supply of air mixes with the hot exhaust air from the ICT equipment it returns to the CRAC at around 24° C.

The maximum airflow in the cold aisle is determined by how much air can efficiently be introduced through floor grilles. The figure of 1 m3/s is based on 2 No. floor tiles which would be the effective discharge area in front of 1 No. 800 mm wide ICT equipment cabinet sitting in a three tile wide cold aisle (based on typical 600×600 mm floor grilles/tiles).

Figure 6:
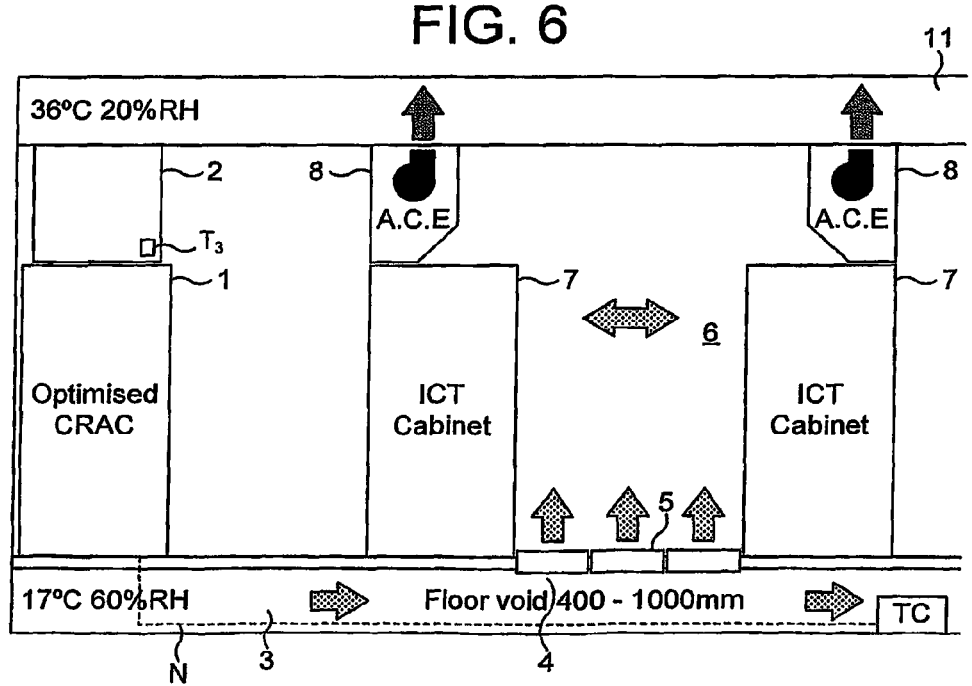
FIG. 6 shows an embodiment of the present invention.

An embodiment of the cooling system of the present invention is detailed in FIG. 6.

The system comprises one or more CRAC units 1, with return air section 2 having monitoring sensing means or one or more sensors. Cool air from the CRAC is applied through a floor void 3 (typically of depth 400 to 1,000 mm) and through grilles 4 formed by floor tiles 5 to a cold aisle 6. ICT cabinets 7 are populated (for example) with 4 blade systems (not shown). Typically, this arrangement might generate 20.4 kW of heat. Of course, other types of ICT equipment may be held by the cabinets. The rear doors of the cabinets are sealed so that temperature is neutral at the rear of the cabinet.

Warm air from the cabinet is exhausted into ACE (Active Cabinet Exhaust) units 8, each of which has variable airflow means and temperature sensing means $T_1$. The variable airflow means may be one, two or more EC variable speed fans (just one is shown for clarity in FIG. 7), air volume control damper 10 (FIG. 12) with variable drive actuators, or any other airflow means.

Figure 7:
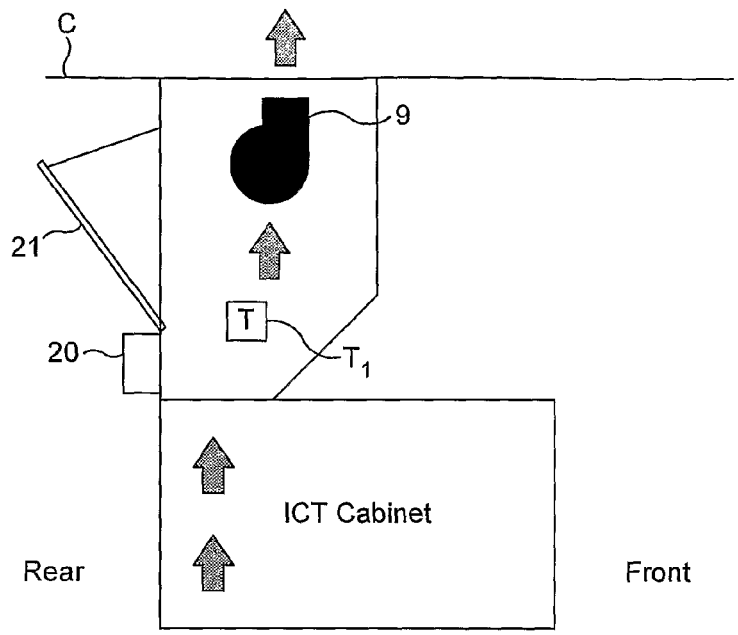
FIG. 7 shows a section through an active cabinet exhaust.

Airflow from the ACE units is directed to, for example, a ceiling void 11 (FIG. 6) (typically of depth 300 to 600 mm) or ducting 12 (FIG. 12) which returns it to the top section 2 of the CRAC 1. The ACE units include a controller 20. They also may include an incident panel or flap 21, which can be arranged (by a spring mechanism or otherside) to release upon a high temperature alarm to vent the cabinet to the room. FIG. 7 also shows a suspended ceiling C (being part of the ceiling void).

The ACEs (Active Cabinet Exhaust) 8 are fitted with EC fans that modulate the airflow away from the rack varying the air volume to suit the ICT equipment housed in the cabinet—see FIG. 7 for an ACE section detail. If there are only a few items with a low heat dissipation then the fan will move more slowly and if there is a lot of high heat density equipment in the rack it will be operating near its maximum setting. This ensures that racks that are housing varying types and quantities of equipment are controlled individually. The ACE also ensures that no air is free to re-circulate back into the cold aisle and interrupt the temperature controlled cool air supplied to the front of the cabinets.

The airflow off the cabinets (with, for example, 4 blade servers) might be at, say, 36° C. (at a flow rate of 0.88 m³/S).

Standard CRAC units have a constant air volume and control to return air temperature, altering the supply temperature to the space depending on the sensed cooling demand. CRAC units according to the present invention, may be optimised so they could operate with higher temperature differentials across them and control to a constant temperature differential with the airflow changing to suit the requirements of the ICT equipment. Once again the ICT equipment can cool itself assuming it is presented with the right amount of air at the right temperature.

As shown in FIG. 6, high return air temperature can be achieved, such as 36° C. The higher return air temperatures would mean that freecooling would be approximately twice as efficient than with standard systems. Freecooling systems do not form part of this patent application, but the cooling system would be able to utilise them far more than any current cooling system.

The maximum airflow on the cool aisle 6 might be, say, 2 m³/S (1 m³/S per rack). This equates to 22.8 kW.

The main benefits of a cooling system according to the present invention would be as follows;

1. Planet CRAC airflow and temperature differential match that of ICT equipment which improves efficiency.

2. Redundancy can be applied at the zone or room level, as with standard CRAC systems, reducing the amount of cooling plant required.

3. The system is more efficient at higher return air temperatures and is therefore comparatively smaller than current systems taking up less technical space.

4. CRAC fans are speed controlled to maintain constant temperature differential and vary airflow to suit cooling demand of ICT equipment.

5. ACE is speed controlled to provide constant return air temperature even with varying heat loads within individual racks.

6. ACE can be fitted to most ICT equipment cabinets.

7. ACE incident panel releases upon high temperature alarm so that the thermal inertia of the room is used to absorb heat rejected from the rack and thus increasing time to thermal cut-out of ICT equipment in event of cooling failure to multiples of minutes, not seconds as with rack cooler.

8. All secondary cooling mediums, water etc can be routed outside of the technical space, only air is controlled in the IT space.

9. Exhaust air from servers is actively managed so that the correct amount is transferred back to the CRAC, at the right temperature, preventing hot spots or the need to oversupply the room.

10. It is possible to absorb up to about 22 kW of heat per rack reliably as opposed to approx. 10 kW of heat per rack with a standard CRAC system.

11. By varying airflow per rack the room does not have to be overcooled to prevent hot spots.

12. At the higher return air temperatures the energy saving opportunities are huge and some form of freecooling would be available for up to 95% of the year at current UK climatic conditions.

As shown in FIG. 7, the ACE fans vary airflow to maintain contact temperature from rack discharge, thus matching the heat load from the ICT equipment.

FIGS. 8 to 11 show some examples of control and sensing strategy of the system within the IT space and does not include control options for external cooling or heat rejection plant which would be as is currently available in the market. In each, figure N is a network/control cable.

The selection of each option would be based on the particular requirements of each individual solution.

Figure 8:
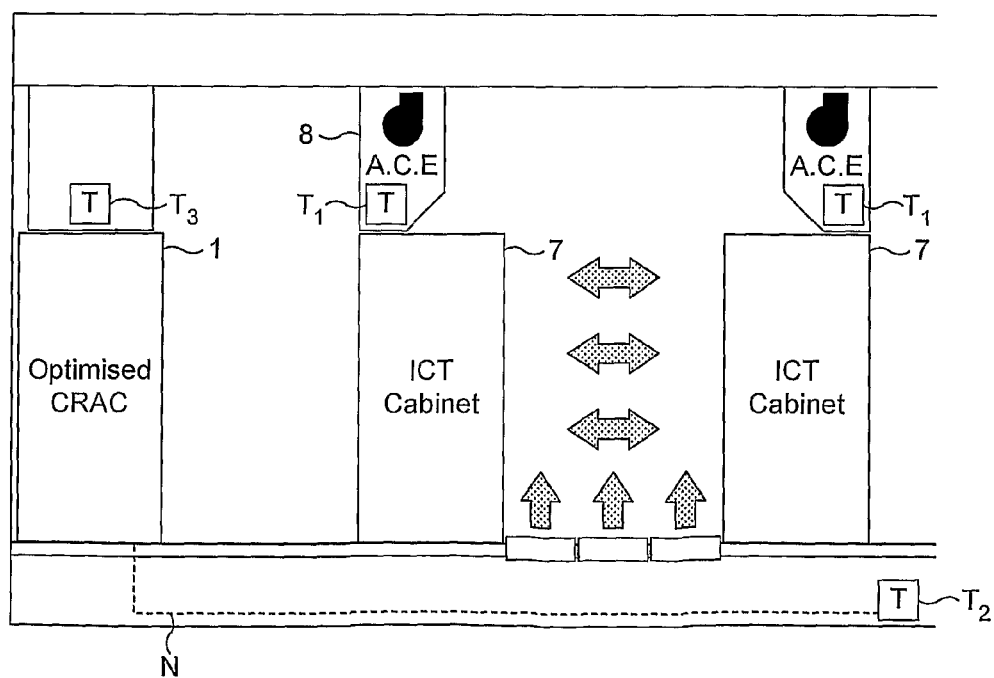
FIG. 8 shows a sensor strategy for standard control.

Standalone Temperature Control—FIG. 8

At the ACE

Fan speed and therefore airflow is determined by ACE temperature sensor values $T_1$ and driven by ACE controller.

At the CRAC

Cooling demand is determined by supply air sensor(s) $T_2$ (in void) and return air sensor(s) $T_3$. Cooling demand is calculated by the microprocessor and fan speed and compressor voltage/chilled water valve (of the CRAC) is driven accordingly.

Figure 9:
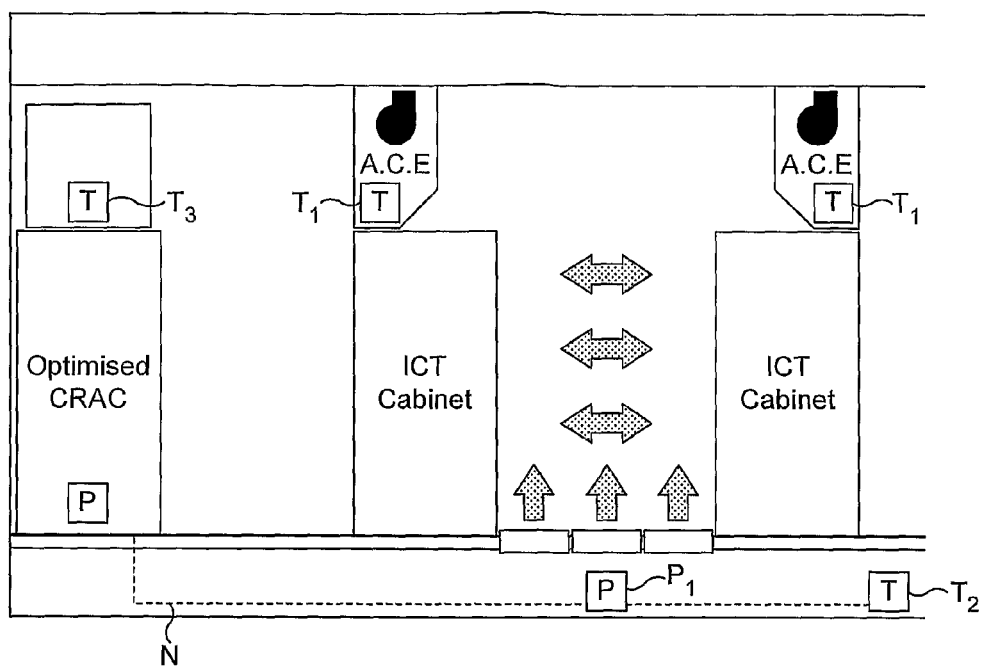
FIG. 9 shows a sensor strategy for standard temperature/pressure control.

Standalone Temperature/Pressure Control—FIG. 9

At the ACE

Fan speed and therefore airflow is determined by ACE temperature sensor values and driven by ACE controller.

At the CRAC

Cooling demand is determined by supply air sensor(s) (in void) and return air sensor(s). Cooling demand is calculated by the microprocessor and compressor voltage/chilled water valve is driven accordingly.

Sub-floor pressure is measured via floor void or CRAC fan mounted pressure sensors $P_1$ and communicated to CRAC microprocessor.

CRAC airflow is then based on cooling demand and sub-floor pressure—whichever is the higher airflow demand is communicated to fans via CRAC microprocessor.

Figure 10:
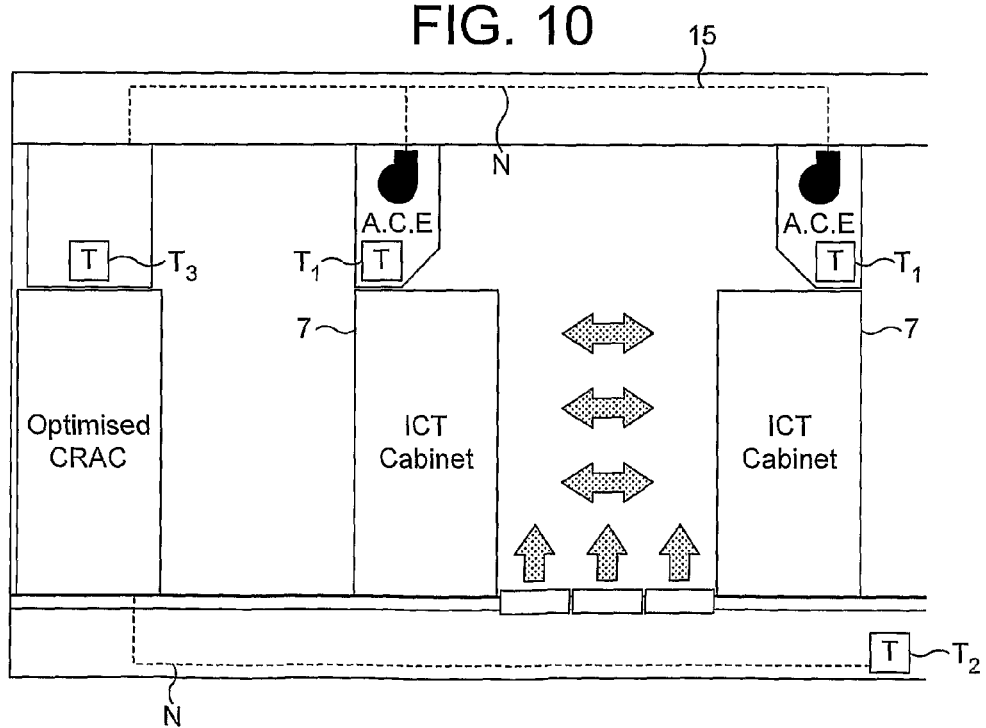
FIG. 10 shows a sensor strategy for network temperature/volume control.

Networked Temperature/Volume Control—FIG. 10

At the ACE

Fan speed and therefore airflow is determined by ACE temperature sensor values and driven by ACE controller.

Fan speed is extrapolated into airflow rate (via EC fans) and communicated via LAN 15 to CRAC. The LAN (or a WLAN) is a cabling (or perhaps a wireless) system connecting the ACE units to the CRAC, for the transmission of signals.

At the CRAC

Cooling demand is determined by supply air sensor(s) $T_2$ (in void) and return air sensor(s) $T_3$. Cooling demand is calculated by the microprocessor and compressor voltage/chilled water valve is driven accordingly.

In this arrangement, combined flow rates of the ACEs are calculated and CRAC airflows are modulated to ensure sufficient over-supply of air (approx. 20% above total ACE flow rates—excess air returns into ceiling plenum via ceiling mounted eggcrate bypass grilles)

CRAC airflow is then based on cooling demand and combined airflow measurement of ACEs—whichever is the higher airflow demand is communicated to fans via CRAC microprocessor.

Figure 11:
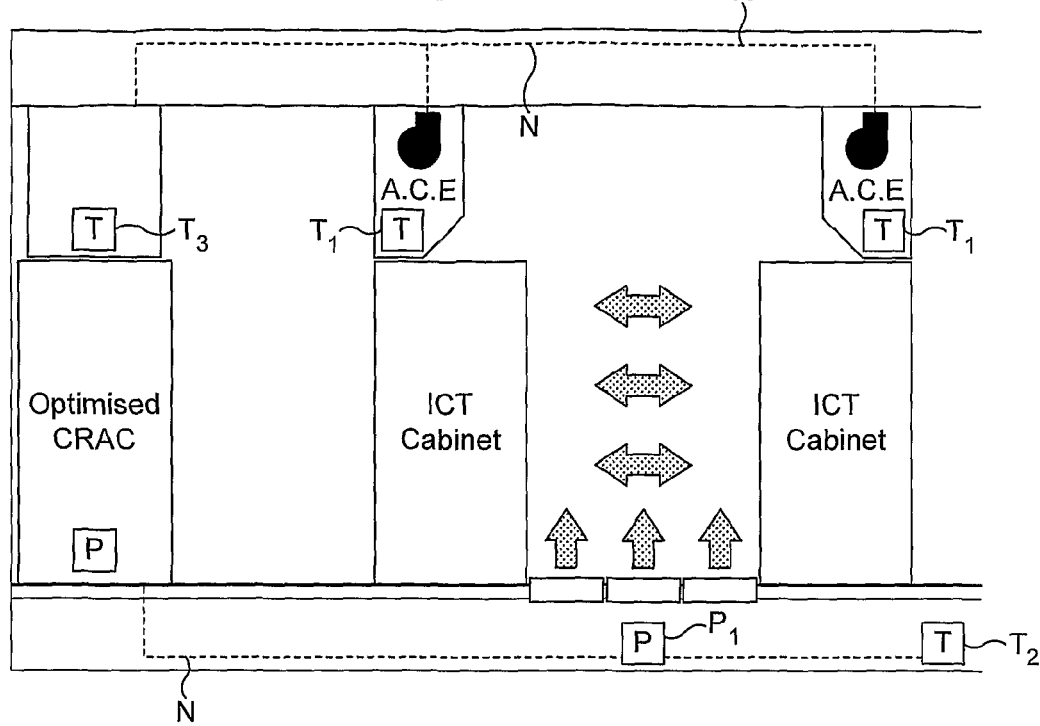
FIG. 11 shows a sensor strategy for network temperature/volume/pressure control.

Networked Temperature/Volume/Pressure Control—FIG. 11

At the ACE

Fan speed and therefore airflow is determined by ACE temperature sensor values and driven by ACE controller.

Fan speed is extrapolated into airflow rate (via EC fans) and communicated via LAN 15 to CRAC.

At the CRAC

Cooling demand is determined by supply air sensor(s) (in void) and return air sensor(s). Cooling demand is calculated by the microprocessor and compressor voltage/chilled water valve is driven accordingly.

Combined flow rates of ACEs calculated and CRAC airflows modulated to ensure sufficient over-supply of air (approx. 20% above total ACE flow rates—excess air returns into ceiling plenum via ceiling mounted eggcrate bypass grilles)

Sub-floor pressure is measured via floor void or CRAC fan mounted pressure sensors and communicated to CRAC microprocessor.

CRAC airflow to be based on cooling demand, combined airflow measurement of ACEs and sub-floor pressure—whichever is the higher airflow demand is communicated to fans via CRAC microprocessor.

Figure 12:
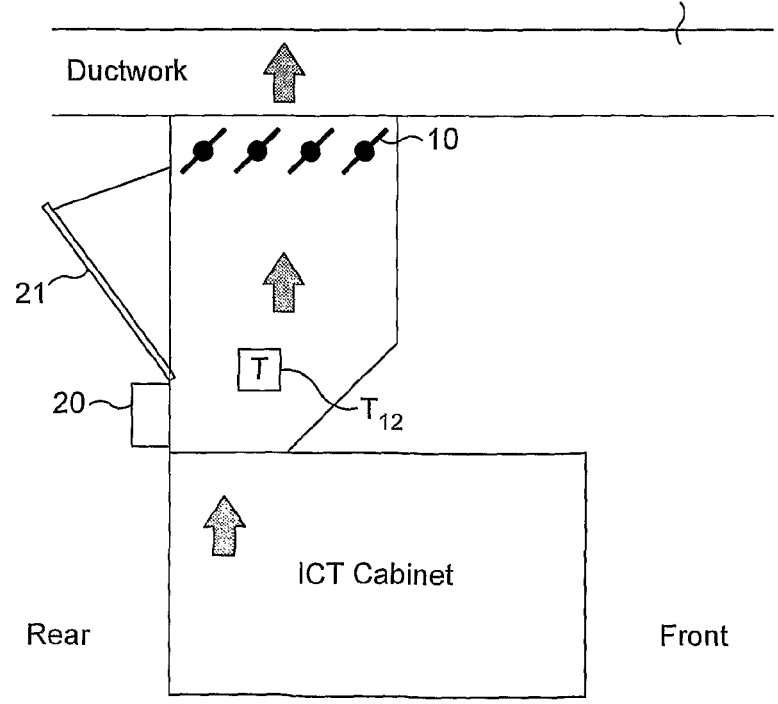
FIG. 12 shows a section through an alternative ACE and a ducted configuration.

In some applications it may be desirable to pass the air back to the Planet CRAC unit(s) not via a ceiling plenum but via solid ducting, as shown in FIG. 12. Note that this ducting may be used with any embodiment, not just the damper ACE shown in FIG. 12.

Although the standard fan driven ACE (Active Cabinet Exhaust) may be used, it would also be possible to use the CRAC unit fans, although up rated, to draw air through the return ductwork. In this configuration the ACE would be constructed as shown in FIG. 12. The operation in terms of control would be identical to the standard Planet VAVIT Cooling System but the ACE would be fitted with a damper 10 with a variable control device actuator which would modulate to control the airflow and in doing so the return air temperature back to the CRAC unit(s) in the same way as the variable speed fans do on the standard ACE component. The ACE damper 10 varies airflow back to the CRAC to maintain contact temperature from rack discharge, thus matching heat load from the ICT equipment. $T_{12}$ is a temperature sensor in the air stream.

Note that an ACE will generally be mounted to each rack.

Figure 13:
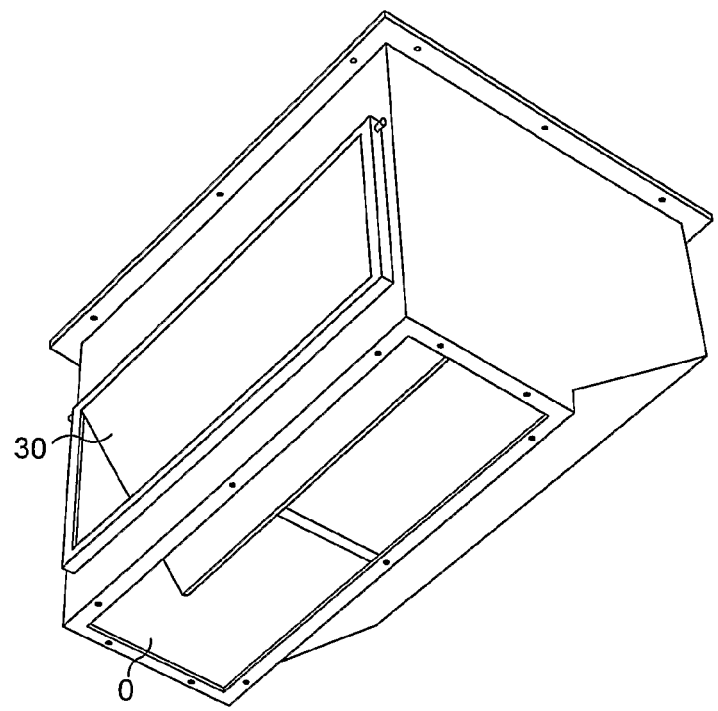
FIG. 13 shows an ACE from below.
Figure 14:
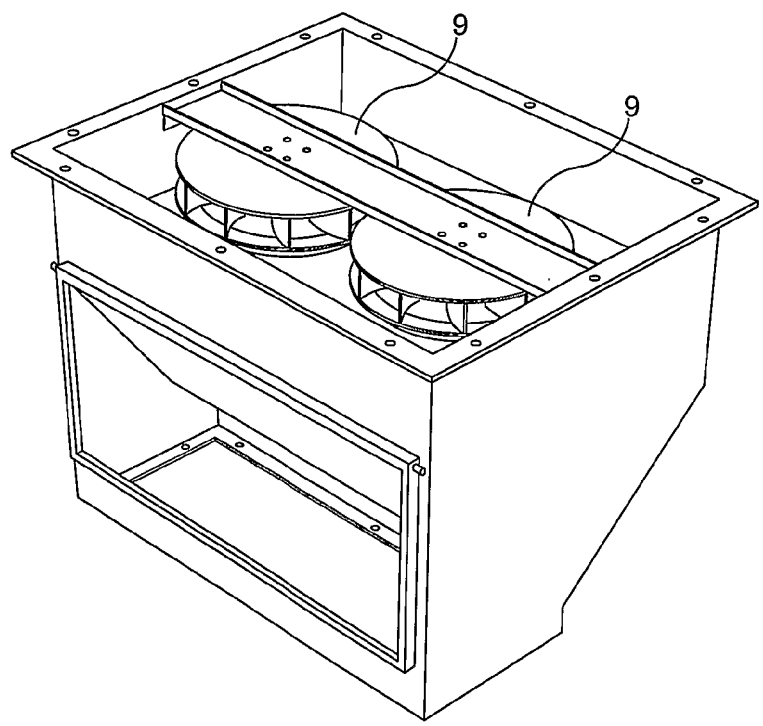
FIG. 14 shows an ACE from above.

FIGS. 13 and 14 shows respective views of an ACE unit from generally below and above. Two fans 9 are included. The opening O on the underside of the ACE receives airflow from the rack.

In the embodiments of FIGS. 13 and 14, the flap 30 opens inwardly (as opposed to opening outwardly as in the embodiment of FIG. 7, for example). Any embodiment of the invention may use inwardly opening flaps. These can be safer in terms of health and safety and can also seal off the fans and allow air to exhaust more efficiently.

The invention claimed is:

1. A system for cooling an environment housing a plurality of electronic equipment in one or more ICT (Information Communication Technology) equipment cabinets, comprising:
one or more remote cooling units including a return side and a supply side, the one or more remote cooling units introducing relatively cool air into the environment from the supply side and receive return air at the return side;
a plurality of active cabinet exhaust products, wherein each associated with a respective ICT equipment cabinet of the one or more ICT equipment cabinets for receiving discharge air from said respective ICT equipment cabinet, each of the plurality of active cabinet exhaust products being provided with temperature sensing means and variable airflow means, wherein the temperature sensing means senses a temperature of the discharge air from each of the one or more ICT equipment cabinets, a temperature of the return air, and a temperature of the relatively cool air;

airflow determining means for determining discharge airflow from each of the plurality of active cabinet exhaust products;

combined airflow means for determining a combined airflow from the discharge airflow of all of the plurality of active cabinet exhaust products;

cooling parameter means for using the combined airflow to determine one or more cooling parameters such that the plurality of active exhaust products optimize the discharge airflow across each of the one or more ICT equipment cabinets while the remote cooling unit operates at a constant temperature differential between the relatively cool air and the return air; and airflow demand means utilizing the temperatures sensed by the temperature sensing means to determine an airflow demand to be provided by the one or more remote cooling units as the relatively cool air, wherein the one or more remote cooling units receive the return air at a relatively high temperature and vary air volume of the relatively cool air as a means of controlling cooling capacity to maintain the constant temperature differential.

2. The system as claimed in claim 1, wherein the one or more ICT equipment cabinets exhaust the discharge air from or toward a top of the one or more ICT equipment cabinets.

3. The system as claimed in claim 2, wherein the discharge air is discharged into a ceiling void or duct from where the discharge air is received by the one or more remote cooling units.

4. The system as claimed in claim 2, wherein the relatively cool air is provided from the one or more remote cooling units into a floor void, and the relatively cool air is provided from the floor void via one or more vents to an area in the vicinity of the one or more ICT equipment cabinets.

5. The system as claimed in claim 2, wherein each of the variable airflow means at each of the plurality of active cabinet exhaust products controls the discharge air from the respective ICT equipment cabinet and by sensing cooling demand from the respective ICT equipment cabinet, the output of the one or more remote cooling units is varied.

6. The system as claimed in claim 1, further including pressure sensing means sensing a pressure, and the airflow demand means utilizes the pressure to determine the airflow demand.

7. The system as claimed in claim 6, wherein the pressure sensing means is provided within a floor void to receive the relatively cool air from the one or more remote cooling units.

8. The system as claimed in claim 1, wherein the airflow demand from the one or more remote cooling units is determined by a higher of the cooling demand from the one or more ICT equipment cabinet and the combined airflow of the plurality of active cabinet exhaust products.

9. The system as claimed in claim 8, including pressure sensing means for sensing pressure of the relatively cool air by the one or more remote cooling units.

10. The system as claimed in claim 9, wherein the airflow demand from the one or more remote cooling units is determined by a higher of the cooling demand, the combined airflow from the plurality of active cabinet exhaust products, and the pressure from the pressure sensing means.

11. The system as claimed in claim 10, wherein the pressure is measured in a floor void.

12. The system as claimed in claim 11, wherein the variable airflow means comprises one or more variable speed fans.

13. The system as claimed in claim 11, wherein the variable airflow means comprises variable damper means.

14. The system as claimed in claim 5, wherein each of the plurality of active cabinet exhaust products is mounted on each ICT equipment cabinet to receive the discharge air directly therefrom.

15. A cooling apparatus for data centres, each data centre comprising one or more ICT equipment cabinets housing ICT equipment within an environment of the data centre, the environment is cooled by at least one remote cooling units including a return side and a supply side, the one or more remote cooling units introducing relatively cool air into the environment from the supply side and receive return air at the return side, the cooling apparatus comprises:

a plurality of active cabinet exhaust products, each of the plurality of active cabinet exhaust products being mounted to receive discharge air from a respective ICT equipment cabinet of the one or more ICT equipment cabinets and each of the plurality of active cabinet exhaust products having variable airflow means which is controlled to maintain a constant return air temperature, each of the plurality of active cabinet exhaust products being provided with temperature sensing means, wherein the temperature sensing means senses a temperature of the discharge air from each of the one or more ICT equipment cabinets, a temperature of the return air, and a temperature of the relatively cool air;

airflow determining means for determining discharge airflow from each of the plurality of active cabinet exhaust products;

combined airflow means for determining a combined airflow from the discharge airflow of all of the plurality of active cabinet exhaust products;

cooling parameter means for using the combined airflow to determine one or more cooling parameters such that the plurality of active exhaust products optimize the discharge airflow across each of the one or more ICT equipment cabinets while the remote cooling unit operates at a constant temperature differential between the relatively cool air and the return air; and airflow demand means utilizing the temperatures sensed by the temperature sensing means to determine an airflow demand to be provided by the one or more remote cooling units as the relatively cool air, wherein the plurality of active cabinet exhaust products varies an amount of the relatively cool air introduced by airflow of the at least one remote cooling units.

16. The cooling apparatus as claimed in claim 15, wherein the variable airflow means is one or more fans or variable dampers.

17. The cooling apparatus as claimed in claim 16, including means for using indirect freecooling.

18. A method of controlling a climate of a data centre, comprising:

providing one or more remote cooling units including a return side and a supply side, the one or more remote cooling units introducing relatively cool air into the data centre from the supply side and receive return air at the return side outputting relative cooling air from the at least one remote cooling units to a data centre, and the data centre includes at least one ICT equipment cabinet;

receiving discharge air into at least one active cabinet exhaust product from the at least one ICT equipment cabinet, wherein each of the at least one active cabinet exhaust product comprises variable airflow means and means for returning the discharge air, via the active airflow means, back to the at least one remote cooling units;

sensing one or more parameters to determine a cooling demand or other cooling parameters;

sensing with temperature sensing means of the at least one active cabinet exhaust product a temperature of the discharge air from each of the one or more ICT equipment cabinets, a temperature of the return air, and a temperature of the relatively cool air;

determine with airflow determining means a discharge airflow from each of the plurality of active cabinet exhaust products;

determine with combined airflow means a combined airflow from the discharge airflow of all of the plurality of active cabinet exhaust products;

using the combined airflow with cooling parameter means to determine one or more cooling parameters such that the plurality of active exhaust products optimize the discharge airflow across each of the one or more ICT equipment cabinets while the remote cooling unit operates at a constant temperature differential between the relatively cool air and the return air;

utilizing with airflow demand means the temperatures sensed by the temperature sensing means to determine an airflow demand to be provided by the one or more remote cooling units as the relatively cool air; and varying an amount of the relatively cool air introduced by the at least one remote cooling units according to the at least one active cabinet exhaust product.

19. The method as claimed in claim 18, wherein the plurality of active cabinet exhaust products is mounted to corresponding ones of each of the at least one ICT equipment cabinet.

20. A method for using the system as claimed in claim 14.

21. The system as claimed in claim 1, wherein the variable airflow means comprises variable damper means.

* * * * *